United States Patent [19]

Nishikawa

[11] Patent Number: 5,337,287

[45] Date of Patent: Aug. 9, 1994

[54] DUAL PORT SEMICONDUCTOR MEMORY DEVICE

[75] Inventor: Yasushi Nishikawa, Kawasaki, Japan

[73] Assignee: NEC Corporation, Tokyo, Japan

[21] Appl. No.: 932,571

[22] Filed: Aug. 20, 1992

[30] Foreign Application Priority Data

Aug. 20, 1991 [JP] Japan .................................. 3-232296

[51] Int. Cl.[5] ................................................ G11L 8/00
[52] U.S. Cl. ........................... 365/230.05; 365/230.03; 365/230.02; 365/230.08; 365/189.01
[58] Field of Search ....................... 365/230.03, 230.02, 365/230.05, 230.08, 230.01, 189.01

[56] References Cited

U.S. PATENT DOCUMENTS 4,602,356 7/1986 Nozaki et al. .................. 365/230.02

Primary Examiner—Eugene R. LaRoche
Assistant Examiner—Huan Hoang
Attorney, Agent, or Firm—Sughrue, Mion, Zinn, Macpeak & Seas

[57] ABSTRACT

A semiconductor memory device of the present invention is a dual port RAM with write-per-bit function which includes main input buffer circuits and sub input buffer circuits, which take the function of write inhibit detection circuits, and extension bus lines connecting the main and sub input buffer circuits. In the dual port RAM, elements which perform the write inhibit function are not collectively arranged around the data input-/output terminals, and, therefore, it is suitable to partitioning of a memory cell array into a plurality of blocks as required due to increase of memory capacity and integration density of the dual port RAM.

7 Claims, 5 Drawing Sheets

DUAL PORT SEMICONDUCTOR MEMORY DEVICE

BACKGROUND OF THE INVENTION

1. Field of the Invention

The present invention relates to a dual port semiconductor memory device and, particularly, to a dual port random access memory (RAM) having a write-per-bit function in which memory cells are read serially and written randomly.

2. Description of the Prior Art

A dual port DRAM to be arranged between a CPU of a compact computer such as personal computer and a data display device for displaying read/write under control of the CPU is commercially available and has been used widely for image processing purpose. Such dual port RAM includes input/output buffer circuits capable of storing a plurality of bits to realize functions such as serial data transfer function and flush clear function, etc. A dual port RAM having such construction as above mentioned is disclosed in U.S. Pat. No. 4,669,064 issued to Ishimoto and assigned to the assignee of this application. In the disclosed dual port RAM, in order to improve image processing speed and flexibility, a memory information is read in time-serial from the input-/output buffer circuits through serial ports and a memory information is written randomly through an arbitrary stage of the input/output buffer circuits. The above mentioned write operation of memory information is referenced to as "write-per-bit" function.

Describing the write-per-bit function in more detail, the dual port RAM with write-per-bit function disclosed in Ishimoto '064 comprises a memory cell array composed of a plurality of memory cells each arranged at each of intersections of a plurality of rows or bit lines, and a plurality of columns or word lines, means responsive to a row address signal for selecting one of the bit lines, a plurality of bus lines, means responsive to a column address signal for selectively connecting the bus lines to the same number of the columns or word lines, respectively, a plurality of data input/output terminals, a plurality of input/output buffer circuits having input sides connected to the respective data input/output terminals and output sides connected to the bus lines for holding data from the data input/output terminals during a write cycle, a plurality of write-inhibit signal detection circuits arranged correspondingly to the data input/output terminals for detecting presence or absence of a write inhibit signal to be supplied at a start time of the write cycle and a plurality of control circuits provided correspondingly to the respective input/output buffer circuits to disable the input/output buffer circuits when the detection circuits detect write inhibit signals, and only data stored in the input/output buffer circuits which are not inhibited by the write inhibit signal can be written in the memory cells during the write cycle.

The dual port RAM with write-per-bit function has not only its inherent functions, that is, functions of simultaneous read of a plurality of bits, for example, 4 bits, by random access and of serial read of multi words (4 bits $\times$ 64K words) by serial access, but also the function of random write from serial ports for arbitrary bits. Therefore, such RAM is more suitably adapted to the image processing.

On the other hand, with an improvement of semiconductor manufacturing technology to make integration density of a semiconductor chip higher, an area of the semiconductor chip to be occupied by each memory cell was reduced, so that memory capacity of a memory cell array was increased substantially. Indeed, memory capacity of an RAM was increased from 256K bits through 1M bits to 4M bits in recent several years. In order to prevent increase of peak current and decrease of operation speed of the memory cell array due to increased memory capacity thereof, a layout of the memory cell array on the semiconductor chip becomes important, since bit lines and word lines become longer, signal delay occurs due to increased resistance of the long word lines and signal amount is reduced due to increase of stray capacitance of the longer bit lines. For example, in T. Watanabe, "A Battery Backup 64K CMOS RAM with Double Level Aluminum Technology", ISSC DIGEST OF TECHNICAL PAPERS, Feb. 1983, pp 60–61, it is proposed, in order to solve such problems, to divide a memory cell array forming area of a semiconductor chip into a plurality of blocks. After Watanabe's proposal, the number of blocks is increased beyond that required for a dual port RAM having memory capacity of 256K bits and, thus, data signal lines, that is, word lines, of the memory cell array for data read/write becomes complicated and longer.

On the other hand, in a dual port RAM for image processing in an engineering work station (EWS), bit length of a unit code word becomes longer. Recently, there is commercially available dual port RAMs having bit length of 16 bits. By increasing bit length, the number of the data input/output terminals on the memory chip as well as the number of stages of the data holding means connected to the respective terminals can be increased. However, even in the memory circuit described in the Watanabe article, the balance of characteristics of transistors constituting data signal lines extending from the input/output buffer circuits to the memory cells can not be maintained at a desired level and the stray capacitance problem due to long data signal lines from the input/output buffer circuits to the memory cells can not be solved sufficiently. Further, the signal delay due to long word lines occur in a signal write, memory write speed is substantially lowered and an erroneous operation may occur due to cross-talk among multi bit word lines.

SUMMARY OF THE INVENTION

Therefore, an object of the present invention is to provide a dual port RAM having write-per-bit function, in which a delay of write data due to the above mentioned data signal lines and hence reduction of write speed and occurrence of erroneous operation can be avoided.

According to the present invention, a dual port RAM with write-per-bit function includes main input buffer circuits and sub input buffer circuits, which take the function to be performed by the conventional write inhibit signal detection circuits partially upon themselves, and extension bus lines connecting between the main input buffer circuits and the sub input buffer circuits. In the dual port RAM according to the present invention, division of memory cell array into blocks as required due to increase of memory capacity and integration density thereof can be performed easily since the buffer circuits having write inhibit detection function are not always collectively arranged in the vicinity of data input/output terminals of the RAM.

BRIEF DESCRIPTION OF THE DRAWINGS

The above-mentioned and other objects, features and advantages of the present invention will become more apparent by reference to the following detailed description of the present invention taken in conjunction with the accompanying drawings, wherein.

DETAILED DESCRIPTION OF THE INVENTION

Figure 1:
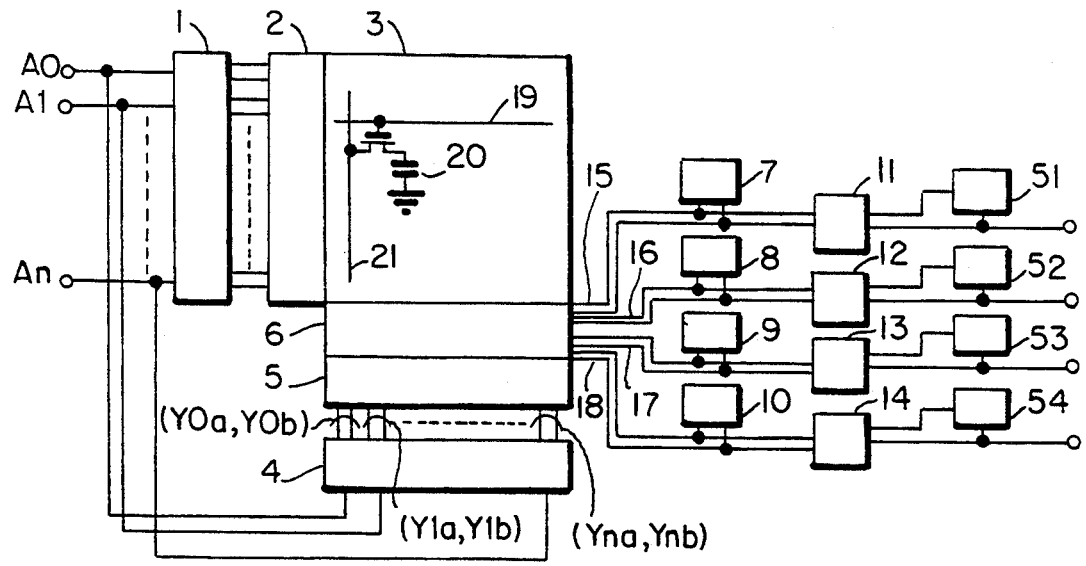
FIG. 1 is a block diagram of a conventional dual port RAM.

In FIG. 1 which shows a conventional dual port RAM in block circuit, it is assumed for convenience of description that the dual port RAM is of multi bit output type which reads/writes data by 4 bits as a unit. Referring to FIG. 1, the dual port RAM comprises a row address buffer 1 for latching row address signals to be supplied to address signal terminals Ao to An, a row address (RAS) decoder 2 responsive to an output of the row signal buffer 1 to select one of a plurality of word lines 19 arranged in a row direction of a memory cell array 3 composed of a matrix of a number of memory cells 20, a column address buffer 4 for latching column address signals to be supplied to the above mentioned terminals Ao to An, a column address (CAS) decoder 5 connected to a plurality (n) of output terminal pairs (Y0a, Y0b), (Y1a, Y1b),..., (Yna, Ynb) from the column address buffer 4 and responsive to an output of the column address buffer 4 to select a plurality of bit line pairs arranged in a column direction of the memory cell array 3 and an input/output connecting circuit 6. In FIG. 1, the bit line pair is depicted by a single line 21. The input/output buffer connecting circuit 6 responds to the output of the column address decoder 5 to selectively connect four (not shown) of the bit line pairs to four bus line pairs 15 to 18, respectively. The bus line pairs 15 to 18 are connected through input/output buffer circuits 11 to 14 to data input/output terminals I/O-0 to I/O-3, respectively. Sense amplifiers 7 to 10 which are adapted to amplify read outputs appearing on the bus line pairs 15 to 18 in a read cycle are connected to the bus line pairs 15 to 18, respectively. To the data input/output terminals I/O-0 to I/O-3, write inhibit control circuits 51 to 54 are connected respectively to detect write inhibit pulses in a data write cycle and supply them to the input/output buffer circuits 11 to 14, respectively.

As is clear from the construction of the dual port RAM shown in FIG. 1, the conventional dual port RAM can send and receive the input/output data through the data input/output terminals I/O-0 to I/O-3 randomly every unit of 4 bits in response to the row address signal and column address signal and can inhibit write of arbitrary bits of a write code word of parallel 4 bits by means of the write inhibit control circuits 51 to 54. Therefore, the write-per-bit function is provided. For a further detail of this RAM, Ishimoto '064 should be referenced to.

Figure 2:
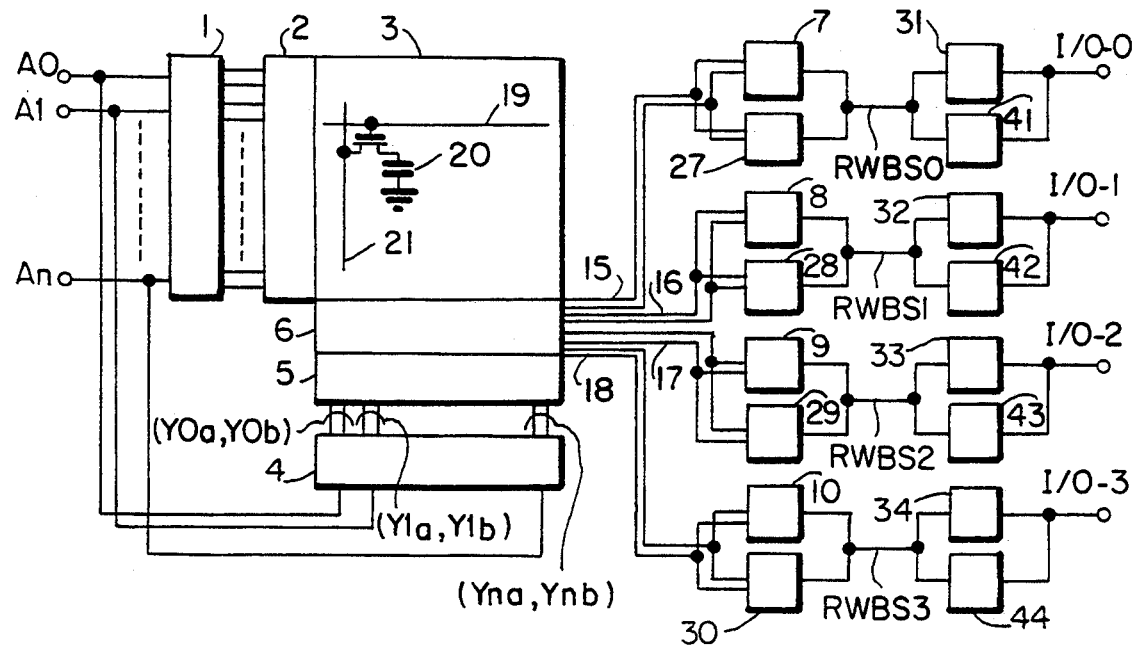
FIG. 2 is a block diagram of a first embodiment of the present invention.

FIG. 2 shows an embodiment of the present invention in block circuit in which same reference numerals as those used in FIG. 1 depict same or similar components, respectively. In FIG. 2, the dual port RAM according to the present invention comprises main input buffer circuits 41 to 44 connected to data input/output terminals I/O-0, I/O-1, I/O-2 and I/O-3, respectively, output buffer circuits 31 to 34 connected in parallel to the main input buffer circuits 41 to 44, respectively, extension bus lines RWBS0 to RWBS3 for connecting the parallel circuits 31 and 41, 32 and 42, 33 and 43 and 34 and 44 to sense amplifiers 7 to 10, respectively, and sub input buffer circuits 27 to 30 are connected in parallel to the sense amplifiers 7 to 10, respectively. Other constitutional components than those mentioned above are same as those of the conventional dual port RAM shown in FIG. 1.

Figure 3:
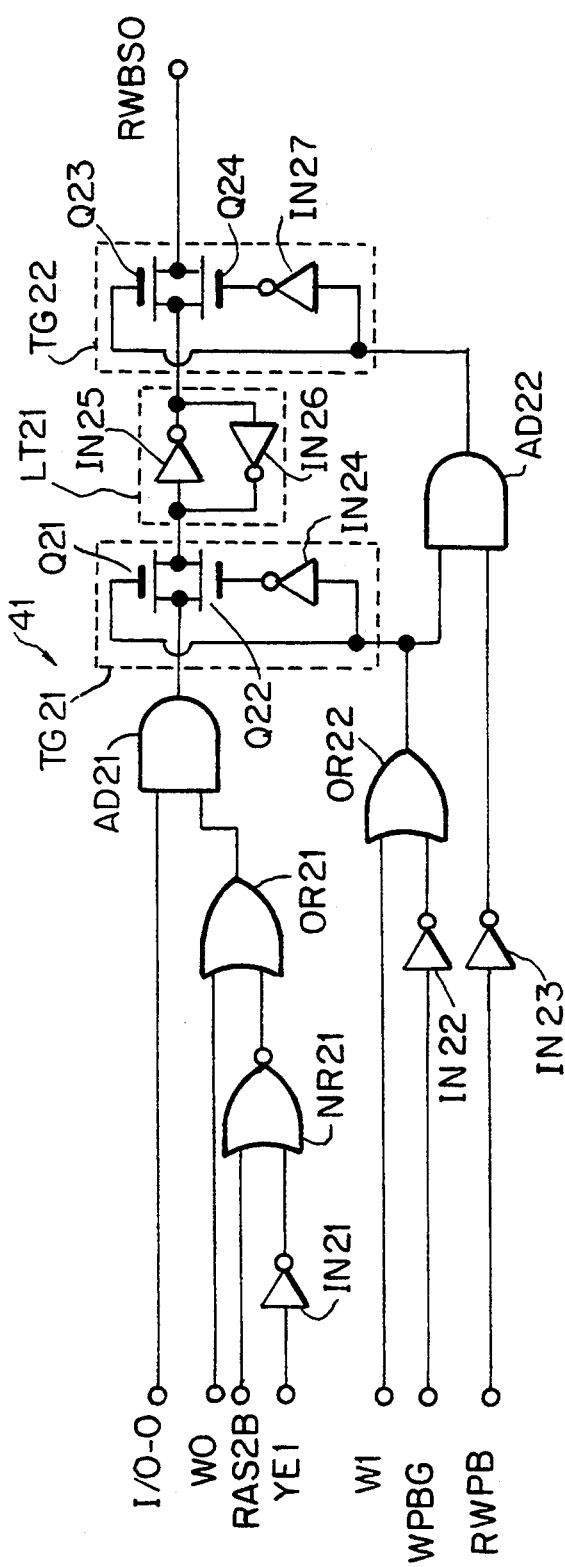
FIG. 3 is a circuit diagram of a main input buffer circuit which is one of constitutional portions of the embodiment shown in FIG. 2.

FIG. 3 shows a circuit construction of the main input buffer circuit. Since the main input buffer circuits 41 to 44 are identical in construction and function, only the main input buffer circuit 41 having construction shown in FIG. 3 will be described. The main input buffer circuit 41 comprises a NOR circuit NR21 having one input terminal receiving a control signal RAS2B and the other input terminal receiving a control signal YE1 through an inverter circuit IN21, an OR circuit OR21 having one input terminal connected to an output of the NOR circuit NR21 and the other input terminal receiving a control signal WO and an AND circuit AD21 having one input connected to an output of the OR circuit OR21 and the other input terminal connected to the data input/output terminal I/O-0. The main input buffer circuit 41 further comprises an OR circuit OR22 having one input terminal receiving a control signal W1 and the other input terminal receiving a control signal WPBG through an inverter circuit IN22, a transfer gate TG21 composed of transistors Q21 and Q22 and an inverter circuit IN24 and responsive to an output of the OR circuit OR22 to receive an output signal of the AND circuit AD21, a latch circuit LT21 composed of a pair of inverter circuits IN25 and IN26 connected in parallel in reverse direction for latching an output of the transfer gate TG21, a transfer gate TG22 composed of a pair of transistors Q23 and Q24 and an inverter circuit IN27 for receiving an output of the latch circuit LT21 and an AND circuit AD22 having one input connected to the output of the OR circuit OR22 and the other input receiving a control signal PWPB through an inverter circuit IN23, an output of which is supplied to the transfer gate TG22. An output of the transfer gate TG22 is supplied to the sub input buffer circuit 27 through the extension bus line RWBS0 as an output of the main input buffer circuit 41.

Figure 4:
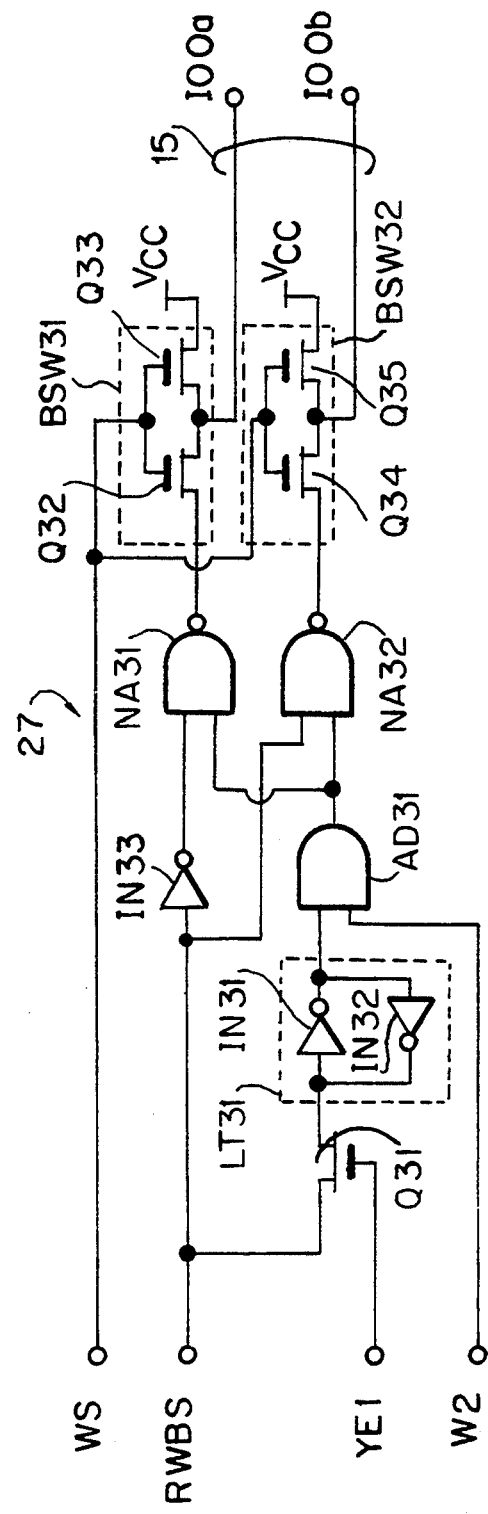
FIG. 4 is a circuit diagram of a sub input buffer circuit which is another constitutional portion of the embodiment shown in FIG. 2.

FIG. 4 shows a circuit construction of the sub input buffer circuit 27. In FIG. 4, the sub input buffer circuit 27 includes a latch circuit LT31 which is composed of a pair of inverter circuits IN31 and IN32 connected in parallel in reverse direction and, in response to the control signal YE1 supplied to a gate electrode of a transistor Q31, latches an output control signal from the extension bus line RWBS0. An output of the latch circuit LT31 and a control signal W2 are supplied to inputs of an AND circuit AD31. An output of the AND circuit AD31 and the control signal from the extension bus line RWBS0 are supplied to input terminals of a NAND circuit NA32. The same control signal from the extension bus line RWBS0 is supplied to one of input terminals of the NAND circuit NA31 through an inverter circuit IN33 and the output of the AND circuit AD31 is supplied to the other input of the NAND circuit NA31. Further, the outputs of the NAND circuits NA31 and NA32 are supplied through a switch circuit BSW31 constituted with transistors Q32 and Q33 and a switch circuit BSW32 composed of transistors Q34 and Q35 to the bus line 15 as write input IO-0a and IO-0b, respectively. The other sub input buffer circuits 28, 29 and 30 have identical circuit construction to that of the sub input buffer circuit 27 and, therefore, details thereof are omitted for avoidance of duplication.

Figure 5:
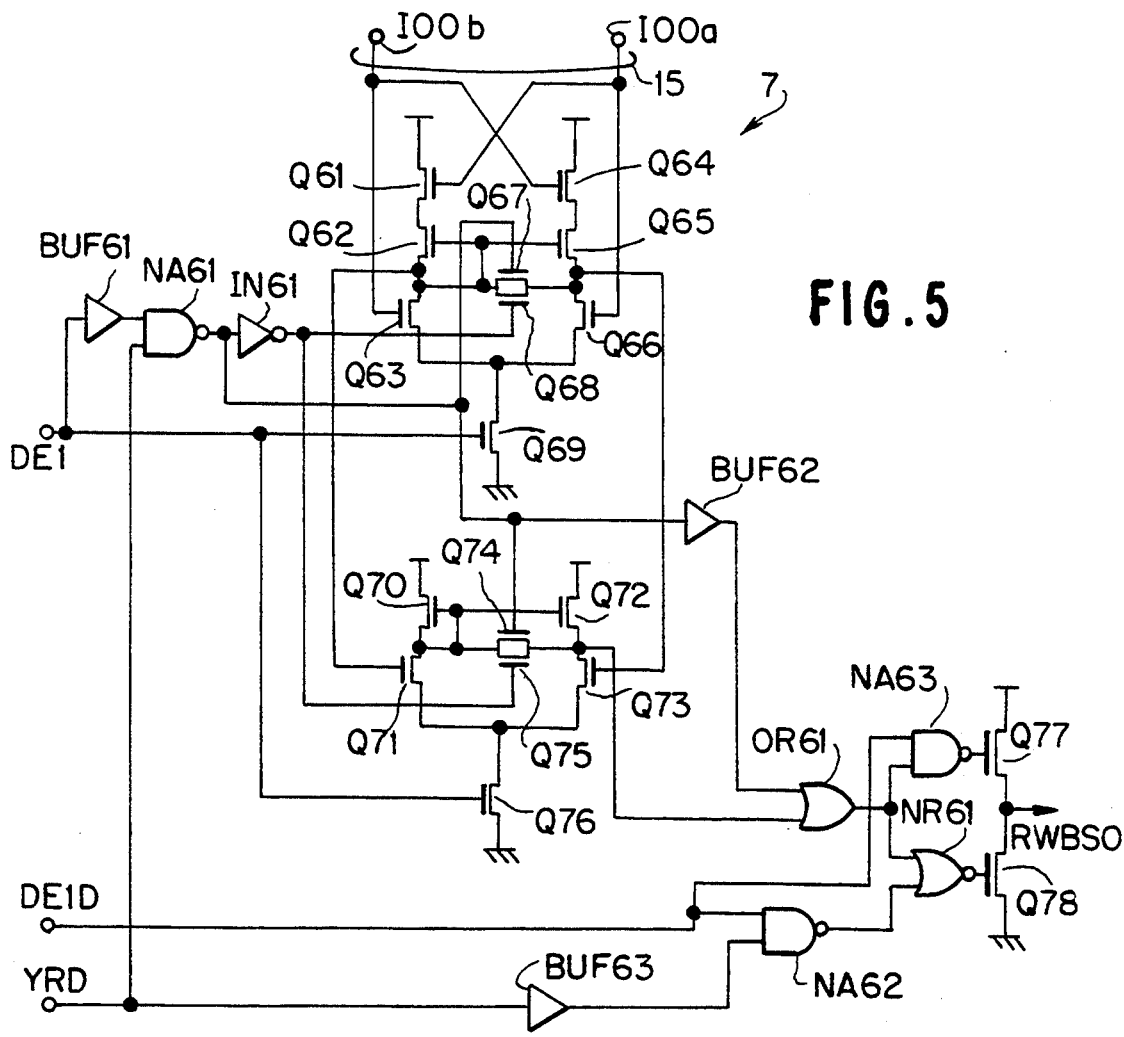
FIG. 5 is a circuit diagram of a sense amplifier which is another constitutional portion of the embodiment shown in FIG. 2.
Figure 6:
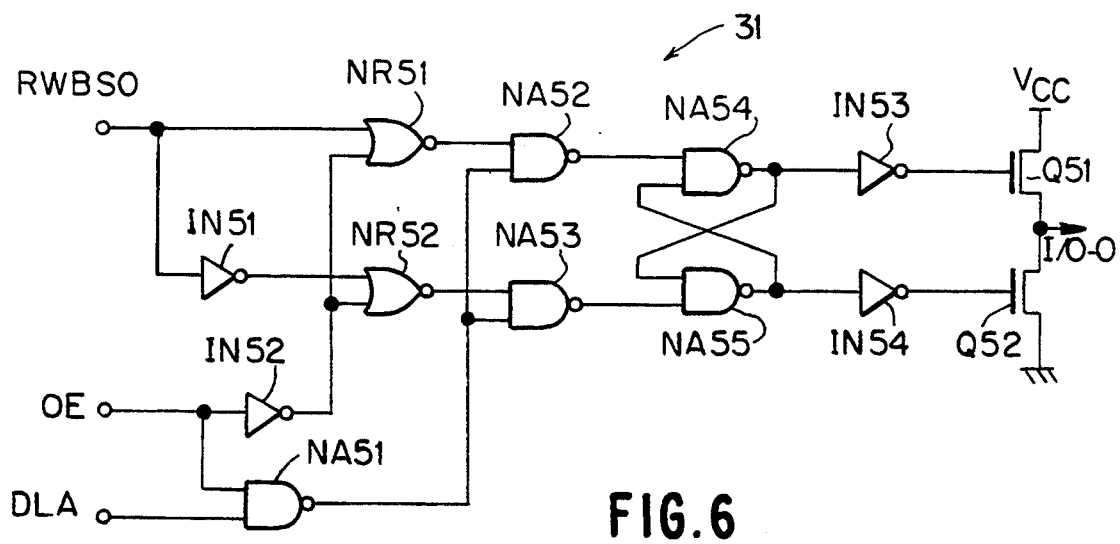
FIG. 6 is a circuit diagram of an output buffer circuit which is another constitutional portion of the embodiment shown in FIG. 2.

FIG. 5 is a circuit diagram of the sense amplifier 7. In FIG. 5, the sense amplifier 7 responds to the pair of read signals IO-0a and IO-0b from the input terminal pair connected to the bus line 15 to read the contents of the above mentioned memory cell under control of control signals DE1, DE1D and YRD and supply them to the output buffer circuit 31 through the extension bus line RWBS0. The output buffer circuit 31 is shown in FIG. 6. The output buffer circuit 31 responds to output signals OE and DLA (a control logic circuit is not shown) to supply the read signal on the extension bus line RWBS0 to the data input/output terminal I/O-0.

In detail, in FIG. 5, the sense amplifier 7 includes a first amplifier circuit composed of transistors Q61 to Q69 and a second amplifier circuit connected in parallel to the first amplifier circuit and composed of transistors Q70 to Q75. These amplifier circuits function to amplify the memory cell output IO-0a and IO-0b supplied through the bus line 15 under control of control signals DE1, DE1D and YRD.

The control signal DE1 is supplied directly to gate electrodes of the transistor Q69 of the first amplifier circuit and the transistor Q76 of the second amplifier circuit. The control signal DE1 is further supplied to one input of a NAND circuit NA61 through a buffer circuit BUF61, the other input thereof being supplied with the control signal YRD. An output of the NAND circuit NA61 is supplied to gate electrodes of the transistor Q67 of the first amplifier circuit and the transistor Q74 of the second amplifier circuit. The output of the NAND circuit NA61 is inverted by an inverter IN61 and supplied to gate electrodes of the transistor Q68 of the first amplifier circuit and the transistor Q75 of the second amplifier circuit.

An output of the first amplifier circuit is amplified by the second amplifier circuit and an output of the second amplifier circuit is supplied to one input of an OR circuit OR61 having the other input connected to the output of the NAND circuit NA61 through a buffer circuit BUF62. An output of the OR circuit OR61 is supplied to one input of a NAND circuit NA63 whose the other input receives the control signal DE1D and to one input of a NOR circuit NR61 whose the other input receives an output of a NAND circuit NA62 having one input receiving the control signal DE1D and the other input receiving the control signal YRD through a buffer BUF63. Outputs of the NAND circuit NA63 and the NOR circuit NR61 are inputted to gate electrodes of a series connected transistors Q77 and Q78, a source/drain junction between which is connected to the extension bus line RWBS0.

In FIG. 6 which shows a circuit construction of the output buffer circuit 31, a read output from the extension bus line RWBS0 is supplied directly to one input of a NOR circuit NR51 and indirectly to one input of a NOR circuit NR52 through an inverter IN51. To the other inputs of these NOR circuits NR51 and NR52, a control signal OE is supplied through an inverter IN52.

Outputs of the NOR circuits NR51 and NR52 are supplied to one inputs of NAND circuits NA52 and NA53, respectively. The other inputs of the NAND circuits NA52 and NA53 receive an output of a NAND circuit NA51 having inputs receiving the control signal DLA and OE, respectively. Outputs of the NAND circuits NA52 and NA53 are supplied to one inputs of NAND circuits NA54 and NA55, respectively. An output of the NAND circuit NA54 is supplied directly to the other input of the NAND circuit NA55 and indirectly to an inverter IN53 having an output connected to a gate electrode of a transistor Q51. An output of the NAND circuit NA53 is supplied directly to the other input of the NAND circuit NA54 and indirectly to an inverter IN54 having an output connected to a gate electrode of a transistor Q52 connected in series with the transistor Q51. Thus, the read output is supplied from the extension bus line RWBS0 to the data input/output terminal I/O-0 through a source/drain junction between the transistors Q51 and Q52.

Figure 7A:
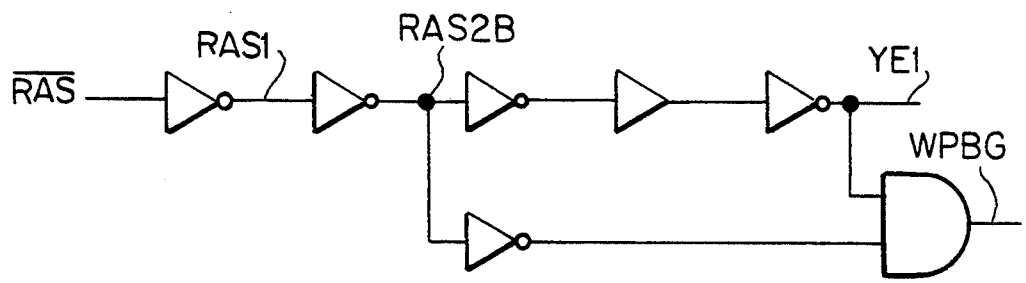
FIG. 7a–7c show logic circuits for generating drive control signals for the embodiment shown in FIG. 2.
Figure 7B:
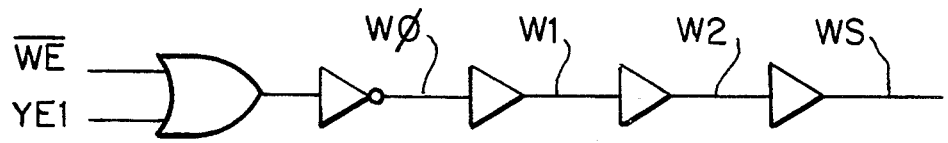
Figure 7C:
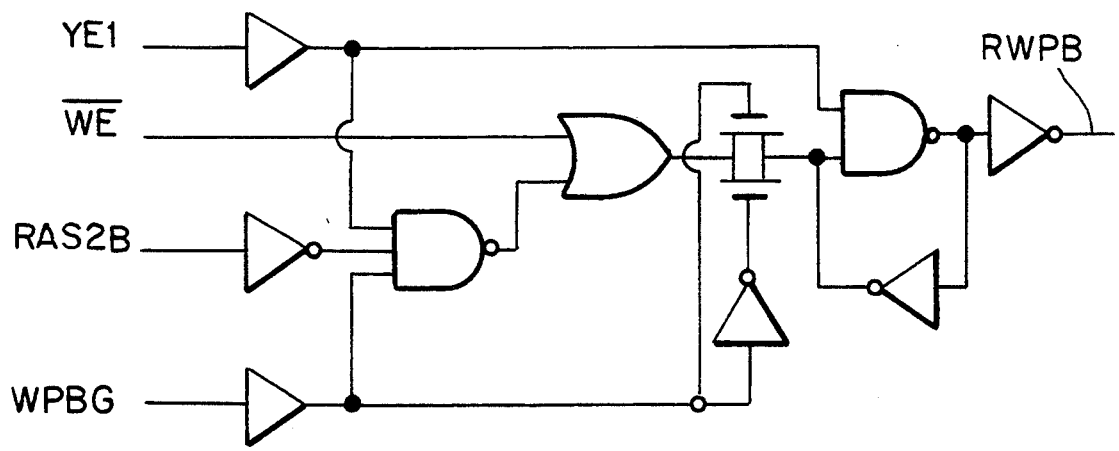
Figure 8:
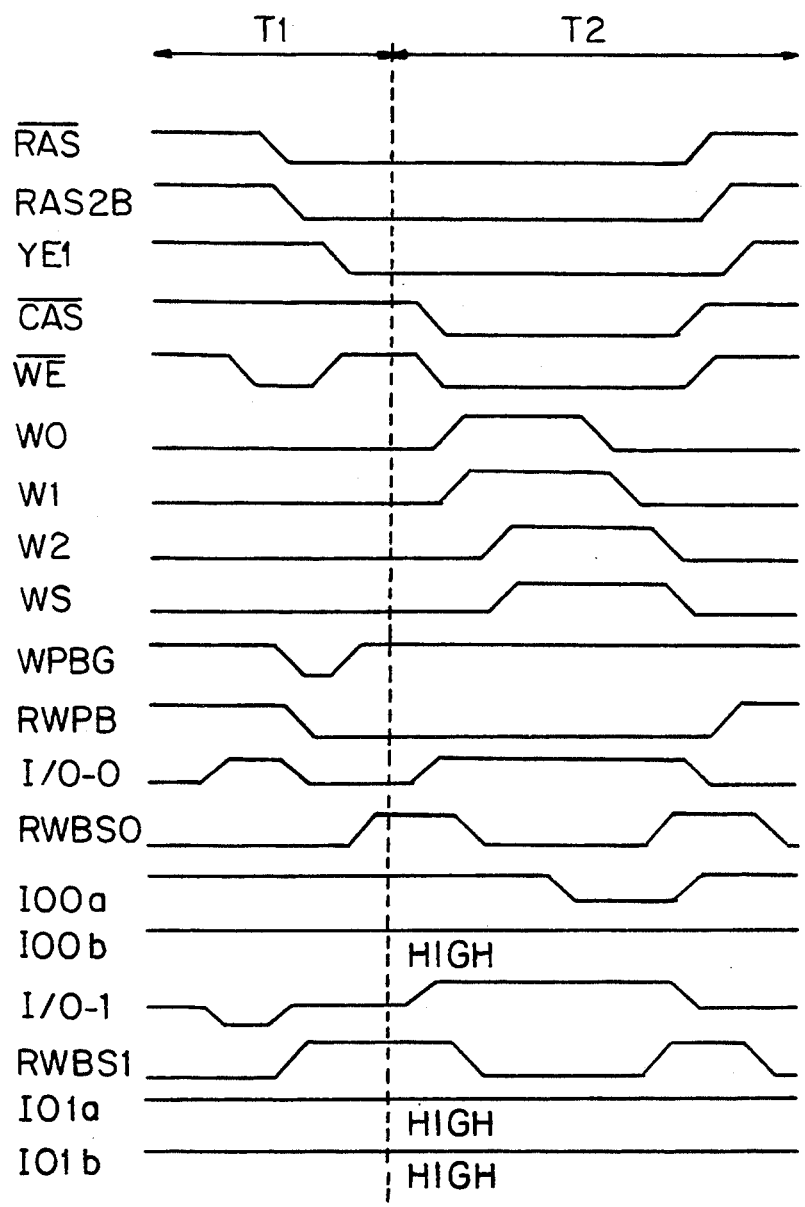
FIG. 8 is a timing chart for explaining an operation of the embodiment shown in FIG. 2.

FIG. 7 shows logic circuits for generating the various control signals mentioned above and FIG. 8 is a timing chart of these control signals. In FIG. 7(a), the logic circuit is adapted to generate the control signals YE1, WPBG, RAS1 and RAS2B on the basis of the row address signal $\overline{RAS}$, FIG. 7(b) is a logic circuit for generating the control signals W0, W1, W2 and WS from the write enable signal $\overline{WE}$ and the control signal YE1 and FIG. 7(c) is a logic circuit for generating the control signal RWPB from the control signals YE1, WE, RAS2B and WPBG. These logic circuits can be constructed in various ways as well known in the art and, therefore, details thereof may be unnecessary. The timing of these control signals is shown in FIG. 8.

An operation of the dual port RAM according to the embodiment will be described with reference to FIG. 8. In a dual port read operation, the control signal WE becomes high level and the control signals W0, W1, W2 and WS become low level. Therefore, the output control signals (RWBS0 to RWBS3) of the main input buffer circuits 41 to 44 as well as the output control signals IO-0a, IO-0b, IO-1a, IO-1b, IO-2a, IO-2b, IO-3a and IO-3b of the sub input buffer circuits 27 to 30 are inactive, the sense amplifiers 7 to 10 and the output buffer circuits 31 to 34 become active to write the information of the memory cell of the dual port semiconductor memory device. As to a write operation for allowing write of individual data (write-per-bit function) for the input/output terminals I/O-0 to I/O-3, the control signals DE1 and DE1D are low level in write periods T1 and T2, causing the output signal of the sense amplifiers 7 to 10 to be inactive. Simultaneously, the control signal OE of the output buffer circuits 31 to 34 become low level and inactive. In the period T1, the row address control signal RAS changes its state from high to low. At this time, the write control signal WE is low level. Therefore, the signal terminals I/O-0 and I/O-1 are supplied with a high level signal and a low level signal, respectively.

The input signal W0 of the main input buffer circuit 41 is low level and the input signals RAS2B and YE1 change their state from high to low. That is, the input signal of the AND circuit AD21 is high level signal at the signal terminal I/O-0 and the input signal of the transfer gate TG21 is high level. The control signal WPBG in the operation period T1 which is initially high is changed to low level and then returned to high level. That is, the high level signal at the signal terminal I/O-0 which appears at the output of the transfer gate TG21 is latched in the latch circuit LT21. Further, the control signal RWPB changes its state from high to low in the period T1 and the high level signal at the output of the latch circuit LT21 is provided on the extension bus line RWBS0.

Since the input signal RWBS0 of the sub input buffer circuit 27 is high level and the control signal YE1 is high level, the high level input signal RWBS0 is latched in a latch circuit LT31 through the transistor Q31.

As to the operation of the main input buffer circuit 42 and the sub input buffer circuit 28 in the same period T1, the input signal W0 is low level. When the input signals RAS2B and YE1 change their states from high to low level, the output signal RWBS1 of the main input buffer circuit 42 becomes low level. Therefore, the input signal RWBS1 of the sub input buffer circuit 28 latches low level.

In operation period T2, the control signals W0, W1, W2 and WS change their states from low to high level. Therefore, the levels of the signals IO-0a and IO-0b on the bus line 15 are changed according to the levels of the signal supplied to the signal terminal I/O-0 to perform a write operation. On the other hand, since the extension bus line RWBS1 is low level, the levels of the bus lines IO-1a and IO-1b are high level (FIG. 8). That is, the signal supplied to the signal terminal I/O-1 is not written during the write operation period T2.

The above description of the input/output terminals I/O-0 and I/O-1 is also applicable to the input/output terminals I/O-2 and I/O-3. That is, circuits connected to the input/output terminals I/0-2 and I/0-3 have the same construction and function as those for the input-/output terminals I/O-0 and I/O-1. Although the unit word of the multi bit output memory has been described as 4-bit word, it is of course possible to select the number of bits arbitrarily.

As described hereinbefore, in the present invention, the function of the write inhibit detection circuit to be arranged in the respective data input/output terminals I/O-0 to I/O-3 of the conventional circuit is partially owed by the main and sub input buffer circuits and there is provided the extension bus line between these circuits. Therefore, the problem of reduced write speed due to increase of the number of blocks caused by increase of memory chip integration density and the problem of inter-signal line cross-talk thereof can be avoided.

Although the present invention has been described with reference to specific embodiments, this description is not meant to be construed in a limiting sense. Various modifications of the disclosed embodiment, as well as other embodiments of the present invention, will become apparent to persons skilled in the art upon reference to the description of the present invention. It is, therefore, contemplated that appended claims will cover any modifications or embodiments as fall within the true scope of the present invention.

What is claimed is:

1. A semiconductor memory device having a write-per-bit function in which a plurality of control data each indicative of one of a write permission and a write inhibition are supplied respectively to a plurality of data input/output terminals during a first period and a plurality of write data are thereafter supplied respectively to said plurality of data input/output terminals during a second period so that one or ones of said write data corresponding to said control data indicative of said write permission are written into a selected memory cell or cells, said memory device comprising a plurality of main-input buffer circuits each having a first input node connected to an associated one of said data input/output terminals and an output node, a plurality of data lines each connected to said output node of an associated one of said main-input buffer circuits, each of said main-input buffer circuits being activated during both of said first and second periods to transfer an associated one of said control data and an associated one of said write data to an associated one of said data lines, a plurality of sub-input buffer circuits each having a second input node connected to an associated one of said data lines and a pair of second output nodes, a plurality of pairs of bus lines, each pair connected to said pair of second output nodes of an associated one of said sub-input buffer circuits, and means for coupling said pairs of bus lines to selected memory cells, respectively, each of said sub-input buffer circuits including first means coupled to said second input node and activated during said first period for temporarily holding an associated one of said control data and second means coupled to said pair of second output nodes and said first means and activated during said second period for driving an associated one of said bus lines in response to an associated one of said write data to thereby write said associated one of said write data into an associated one of said selected memory cells when the control data held in said first means indicates said write permission and for bringing said pair of second output nodes into a high impedance state to thereby inhibit said associated one of said write data from being written into said associated one of said selected memory cells when the control data held in said first means indicates said write inhibition.

2. The memory device as claimed in claim 1, wherein each of said main-input buffer circuits includes a first latch circuit activated during said second period to temporarily latch an associated one of said control data.

3. The memory device as claimed in claim 2, wherein said first means comprises a second latch circuit activated during said first period for temporarily holding an associated one of said control data.

4. The memory device as claimed in claim 1, further comprising a plurality of sense amplifiers each having a pair of third input nodes connected to an associated one pair of said pairs of bus lines and a third output node connected to an associated one of said data lines and a plurality of output buffers each having a fourth input node connected to an associated one of said data lines and a fourth output node connected to an associated one of said data input/output terminals, each of said sense amplifiers being activated in a data read mode to amplify a potential difference between an associated pair of said pairs of bus lines and drive an associated one of said data lines, each of said output buffers being activated in said data read mode to drive an associated one of said data input/output terminals in response to a level on an associated one of said data lines driven by an associated one of said sense amplifiers.

5. A semiconductor memory device comprising a memory cell array including a plurality of word lines, a plurality of pairs of bit lines and a plurality of memory cells each connected to one of said word lines and one of said bit lines, a plurality of pairs of bus lies, a first selection circuit selecting one of said word lines in response to first address information, a second selection circuit selecting ones of said pairs of bit lines and coupling selected ones of said pairs of bit lines respectively to said pairs of bus lines in response to second address information, a plurality of data lines, a control signal generator generating a first and a second control signal in a read mode and generating a third and a fourth control signal and thereafter said third control signal and a fifth control signal in a write-per-bit mode, a plurality of sense amplifiers each connected to an associated one of said pairs of bus liens and an associated one of said data lines, each of said sense amplifiers being activated in response to said first control signal to amplify a potential difference between an associated one of said pairs of bus lines and to drive an associated one of said data lines, a plurality of data input/output terminals, a plurality of output buffer circuits each connected to an associated one of said data lines and an associated one of said data input/output terminals, each of said output buffer circuits being activated in response to said second control signal to drive an associated one of said data input/output terminals in accordance with a level on an associated one of said data lines, a plurality of main-input buffer circuits each connected to an associated one of said data input/output terminals and an associated one of said data lines, each of said main-input buffer circuits being activated in response to said third control signal to transfer a level of an associated one of said data input/output terminals onto an associated one of said data lines, and a plurality of sub-input buffer circuits each connected to an associated one of said data lines and an associated one of said pairs of bus lines, each of said sub-input buffer circuits being activated in response to said fourth control signal to temporarily store a level of an associated one of said data lines as a control level and in response to said fifth control signal to drive an associated one of said pairs of bus lines in accordance with a level of the associated one of said data lines when said control level is in a first state and to not drive the associated one of said pairs of bus lines when said control level is in a second state.

6. The memory device as claimed in claim 5, wherein each of said sub-input buffer circuits includes a data latch circuit which latches the level of the associated one of said data lines to produce said control level.

7. The memory device as claimed in claim 5, wherein said control signal generator further generates a sixth signal in a write mode and each of said sub-input buffer circuits responds to said sixth signal to drive the associated one of said pairs of bus lines in accordance with the level of the associated one of said data lines irrespective of said control level.

* * * * *

UNITED STATES PATENT AND TRADEMARK OFFICE
CERTIFICATE OF CORRECTION

| | |
|---|---|
| PATENT NO. : | 5,337,287 |
| DATED : | August 9, 1994 |
| INVENTOR(S) : | Yasushi NISHIKAWA |

It is certified that error appears in the above-identified patent and that said Letters Patent is hereby corrected as shown below:

Column 9, line 8, delete "lies" and insert --lines--;

line 20, delete "liens" and insert --lines--.

Signed and Sealed this

Eighth Day of November, 1994

Attest:

BRUCE LEHMAN

Attesting Officer      *Commissioner of Patents and Trademarks*